United States Patent [19]

Ferrar

[11] 4,374,901
[45] Feb. 22, 1983

[54] VERY FINE DIAMETER UNIFORM WIRES

[75] Inventor: Carl M. Ferrar, Hartford, Conn.

[73] Assignee: United Technologies Corporation, Hartford, Conn.

[21] Appl. No.: 333,197

[22] Filed: Dec. 21, 1981

[51] Int. Cl.³ .......................................... C23C 11/02
[52] U.S. Cl. .................................... 428/607; 427/52; 427/120; 427/253
[58] Field of Search .............. 428/605, 607, 608, 903, 428/373, 389, 665; 427/253, 216, 217, 46, 52, 120, 250, 252, 117, 309, 319

[56] References Cited

U.S. PATENT DOCUMENTS

| | | | |
|---|---|---|---|
| 3,379,555 | 4/1968 | Haugh | 428/903 |
| 3,549,413 | 12/1970 | McCandless | 428/389 |
| 3,565,676 | 2/1971 | Holzl | 427/253 |
| 3,587,328 | 6/1971 | Schuemann | 73/516 |
| 3,668,017 | 6/1972 | Mandineau | 427/253 |
| 3,887,722 | 6/1975 | Douglas | 427/46 |
| 4,020,700 | 5/1977 | Lopiccolo et al. | 73/516 |
| 4,098,920 | 7/1978 | Miller | 427/46 |

OTHER PUBLICATIONS

Reid & Benner, NBS Tech. News Bull. (1960), vol. 44, No. 2, p. 32ff.
van Tijen, "Iodine Incadescent Lamps" Philips Tech. Rev. (1961/62) vol. 23 n 8/9, pp. 237–242.

Primary Examiner—L. Dewayne Rutledge
Assistant Examiner—J. J. Zimmerman
Attorney, Agent, or Firm—C. G. Nessler

[57] ABSTRACT

Disclosed are very fine wires, of the order of $3-6 \times 10^{-6}$m diameter, having cross sections which are uniform within ±3%. A common drawn tungsten wire is electrolytically etched to a fine diameter, of the order of $2-4 \times 10^{-6}$m. The variations in cross sectional area along the etched wire are eliminated by selectively vapor depositing tungsten on the surface while using resistance heating. The very fine uniform wires enhance the performance of devices such as fluidic angular rate motion sensors.

9 Claims, 1 Drawing Figure

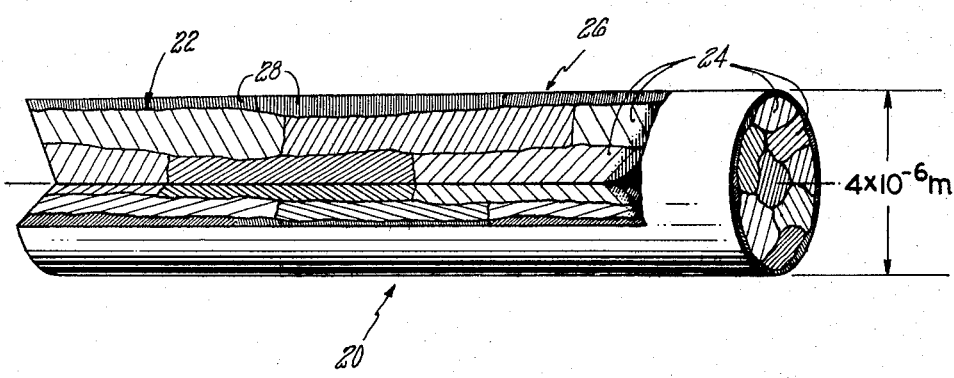

VERY FINE DIAMETER UNIFORM WIRES

DESCRIPTION

1. Technical Field

The present invention relates to the manufacture of very fine metal filaments, particularly those incorporated into fluid jet deflection type instruments for sensing angular movement.

2. Background

Devices for sensing angular movement using a fluid jet are disclosed in various U.S. patents. Schuemann U.S. Pat. No. 3,587,328 and Lopiccolo et al. U.S. Pat. No. 4,020,700 disclose advanced configurations of the basic devices. A fluid, such as an inert gas, is caused to flow laminarly as a jet within an enclosed housing. The fluid is directed toward sensing means comprised of spaced apart temperature sensitive resistive elements, adapted to respond to deviations of the jet. The elements are heated by an electric current flow, and in the absence of any deflection of the jet, they are equally cooled by the jet. When the jet is deflected toward one of the elements, and away from the other, there is an imbalance in cooling which is detected by a suitable electrical circuit. When the housing containing the device is subjected to rotational movement, it is found to cause relative motion of the increment of fluid issuing from the jet and traveling toward the sensing element. Thus, the motion of an object to which the housing is affixed can be sensed through the output of the electrical circuit. Other U.S. Pat. Nos. describing instruments of the foregoing type are 3,500,691, 3,635,095, 3,500,690, 4,020,699, and 4,026,159.

Various configurations of sensing means have been disclosed in the prior art, as reference to the foregoing patents will show. One of the more preferred types of sensor designs is comprised of very fine diameter straight tungsten resistance wires suspended between supports, as shown in U.S. Pat. No. 3,587,328. The wire diameter is of the order of $3-4 \times 10^{-6}$ m. Such fine wires are commercially available, down to about $2 \times 10^{-6}$ m. Typically, they are made by drawing a conventional powder metal product through progressive wire forming dies, to make a wire of the order of $8-13 \times 10^{-6}$ m diameter. To make wires finer, it is not feasible to draw them. Therefore they are electropolished (subjected to an electrical potential while immersed in a conductive medium, to remove material from the surface), to further reduce the diameter. Normally, the electropolishing process is associated with smoothing, with the high points on an article being removed preferentially. Thus, wires so-produced have been considered essentially uniform heretofore. But is has been found that when these commercial types of wires are employed as sensing elements, the resistance matching of the diverse elements is not sufficiently reproducible, from one device to the next, to achieve the stability and accuracy desired in such devices.

DISCLOSURE OF INVENTION

The invention was created when it was discovered that there were substantial cross sectional variations of the order of $\pm 7\%$ in commercial wires, and these variations were found to be a prime source of the non-reproducibility in the devices. An object of the invention is to provide improved fluid jet type angular motion sensing devices with more uniform fine wires. Another object of the invention is to provide uniform cross section filaments of tungsten and other metals, where the diameters of the wires are less than about $10^{-5}$ m.

According to the invention a controlled self-limiting chemical vapor deposition process is used to make wires, such as tungsten wires, which are more nearly uniform than heretofore have been available. The uniform wires are produced from commercial metal wires which have been drawn and chemically reduced in dimension to a small but non-uniform diameter. As an example, non-uniform tungsten wire in the range $2-5 \times 10^{-6}$ m diameter is placed in an atmosphere comprised of a decomposable tungsten compound, such as $WF_6$, and a carrier gas, such as $H_2$, while AC or DC current is applied to the wire. The current resistively heats the wire initially to more than 250°-300° C. but less than 1200° C. Tungsten will be preferentially deposited on the parts of the wire where the cross sectional area is smallest. The use of constant current makes the process self-limiting to a certain maximum diameter; and, the time of exposure is relatively non-critical.

Wires of $3-6 \times 10^{-6}$ m diameter, suitable for fluidic sensor use are produced. They will glow uniformly when resistively heated to low incandescence, compared to wires which have not been processed in accord with the invention. Wires of the order of 2-5 mm length, suitable for fluidic sensor use, will be found to have resistances which are consistently uniform within less than about $\pm 3\%$, and as low as $\pm 1\%$, compared to wires of the prior art which typically are uniform within only about $\pm 7\%$.

BRIEF DESCRIPTION OF DRAWING

The drawing is comprised of one FIGURE showing the metallurgical structure of a wire made in accord with the invention.

BEST MODE FOR IMPLEMENTING THE INVENTION

The invention is described in terms of a fluid jet type motion sensor having fine tungsten wires. Nonetheless, the invention will be seen applicable to sensors having wires of other compositions, and to wires in general which are usable in other kinds of devices.

A study of commercially available wires was made and led to the invention. The nominal diameter of a commercial wire is typically calculated from the resistance or weight of a known length, and the process of its making suggests the diameter would be uniform along a particular length, e.g. 25 mm. But this is not the case, within the uniformity requirements of accurate fluidic sensors. The non-uniformity in wire diameter is manifested by heating a wire to low incandescence (about 700° C.), whereupon portions of the wire are seen to glow while other portions remain dark. A calculation based on incremental resistance along the wire, confirmed by laser beam diffraction, shows that the wire varies in cross sectional area by about 6-20%, corresponding with a diameter variation of about 3-10%. It is suspected that the non-uniformity results from preferential material removal due to variations in crystallographic orientation and composition along the length of the wire. The result is that the cross section becomes irregular (non-circular), and the cross sectional area varies along the length of a wire. Observation indicates that in typical prior art wire of about $3 \times 10^{-6}$ m diameter, the periodicity of the cross sectional area variations is of the order of 1-6 mm along the length of the wire. That is, the major variation in cross sectional area is gradual and takes place along a relatively great length of the wire, compared to its diameter. In a typical angular sensing device the small wires are about 2.5 mm long. The diameter variations mentioned above were deduced to be the cause of the significantly different electrical resistances between wires, thus making them less than optimum for use in accurate sensing devices.

In the practice of the invention, a commercially procured tungsten wire of the foregoing type is utilized. Characteristically, this essentially tungsten material will be about 99+% pure W, and will have been produced by powdered metal and mechanical wire drawing techniques which are well known. One source is the General Electric Company, Cleveland, Ohio. Typically, the wire will have been drawn to a diameter of about $8-13 \times 10^{-6}$ m. It will then be electrolytically etched or polished to a diameter of the order of $2-5 \times 10^{-5}$ m. Wires which have been so produced may be obtained from Thermionic Products Company, North Plainfield, N.J. Or, the commercial drawn wires may be reduced in diameter using techniques described in the following articles: A. F. Mohrnheim, "Electrofinishing of Tungsten Wires," Journal of Metal Finishing (1962) p. 50ff; H. R. Haines and B. W. Mott, "Production of Fine Wires by Electrolytic Polishing," Journal of Scientific Instruments (1953) Vol. 30, p. 459ff; and W. H. Colner et al., "Preparation of Very Fine Wire by Electropolishing," Metal Progress (1951) Vol. 59, p. 795ff. Generally, tungsten wires may be electrolytically polished by immersion in a corrodent such as sodium hydroxide, while AC or DC electrical potential is applied. Microscopic examination of an electropolished wire will reveal a textured surface, reflective of the grain structure, with local areas of preferential attack. Heating to low incandescence, as described, will reveal the larger scale diameter variations.

A wire of about 25 mm length or longer is mounted between conductive electrodes in a controlled atmosphere chamber, such as a borosilicate glass tube or a copper box. Pure hydrogen is introduced into the chamber and AC or DC electric current is caused to flow through the wire, sufficient to raise its temperature to about 800°–1000° C. This causes the removal by chemical reaction and volatilization of surface contaminants, including oxides of tungsten. The average temperature of the wire is then reduced to about 700° C., and stabilized at that level using a power supply which provides constant current to the wire in the processing thereafter. Next tungsten hexafluoride ($WF_6$) is continuously introduced into the chamber together with hydrogen ($H_2$) in volume proportion of about $(1)WF_6:(20)H_2$, with a total pressure of about 0.1–0.9 atmospheres.

The constant current flow through the wire is maintained for a short period of time, typically of the order of a number of seconds. Tungsten hexafluoride comes in proximity with the heated wire and is decomposed by a heat induced reaction with hydrogen, causing tungsten to be deposited on the wire. The HF reaction product diffuses or is flowed away. Because of the thermodynamics of the decomposition process, the tungsten is preferentially deposited on the thinner, and therefore hotter portions of the wire. Thus, the wire is made uniform in diameter within about ±1% in the range of $3-6 \times 10^{-6}$ m, (except where it was cooled by the electrodes). By way of example, a $3.3 \times 10^{-6}$ m wire treated at 700° C. with $3 \times 10^{-2}$ amperes current was made essentially uniform at about $4.6 \times 10^{-6}$ m. The wire uniformity is achieved in my method because of the preferential heating of the thinner wire portions, which resistance heating provides. Of course, other heating means which achieve the same object may be used as well.

It is found that the nominal highest wire temperature during the chemical vapor deposition of tungsten should be maintained below 1200° C., because above such temperatures, a grainy and powdery deposit results. The resultant wire will not be entirely physically sound. At even higher temperatures, approaching 3000° C., deposits of satisfactory character may be obtained, but it will be found that there is a preference for deposition on the colder parts of the wire, i.e., the larger cross section area parts, and this gives a result contrary to the desired uniformity. The temperature should be above 250°–300° C., since below that temperature the rate of reaction is too slow to be practical. When long process times are permissible, the lower temperatures are desirable, since they tend to give the minimum temperature increase where the cross sectional area is greatest. Thus, this will tend to increase the larger cross sectional area parts of the wire as little as possible, and the wires will be made as fine as possible, yet with a uniform diameter.

The volume fraction of $WF_6$ in $H_2$ may be varied; preferably it is about 5%. Lower volume fractions may be utilized, with the result that the deposition process will become slower. Higher volume fractions may be utilized also, up to about 15%. Beyond that level, less satisfactory deposits result. For general process details, see Reid and Brenner, NBS Tech. News Bull., (1960) Vol. 44, No. 2, p. 32ff.

Other heat decomposable reactants in substitution of $WF_6$ may be used in the practice of the invention, providing they contain elemental tungsten metal which preferentially deposits on the hotter areas of the wire. For example, hydrogen gas bearing relatively small quantities of $WCl_6$ or $W(CO)_6$ may be used to deposit tungsten, with some variation in temperatures set forth herein, as are needed to attain the objects of the invention.

The aforementioned process for producing a fine wire is "self-limiting". After limited experiment, a current can be chosen which gives a minimal increase in the wire diameter where it is largest. Yet the current will still provide appreciable heating in the regions of the wire where the diameter is smallest. The heating at any point will be approximately inversely proportionate to the cross section area, or to the square of the diameter. The self-limiting nature of the process is easily demonstrated by test heating the wire to a set luminescence (e.g., 1000° C.) in an inert atmosphere and recording the current, following a prolonged deposition step, using a first current. The deposition step is then repeated using the first current level, and the wire is again test heated to determine the current needed to provide the set luminescence. It will be found that the test heating current is about the same as in the first trial, thus demonstrating no appreciable deposition has taken place.

When a wire is made in accord with the invention, it will be uniform in cross sectional area along its length (apart from the region immediately adjacent to the electrodes, where it will be cooled) within less than about ±3%. That is, the smallest cross sectional area will be greater than 94% of the largest cross sectional area. While entirely accurate measurements are not feasible, it is believed that the variation in cross sectional area of a $4.6 \times 10^{-6}$ m tungsten wire, made using the process above, is less than ±1%. These uniformities have been achieved over lengths of 10–20 mm, at least, and are believed attainable for much greater lengths. Thus, my wire is an improvement over prior art commercial wire which varied over lengths of 1–6 mm by greater amounts. The fact that uniform diameter is achieved is manifested by direct measurement or by heating the wire to low incandescence. In contrast to the same heating before processing, the treated wire will glow evenly.

In the context I use it here, uniformity of diameter means constancy in cross sectional area. That is, the wire produced by my process may not be exactly circular in cross section, though it will tend toward this shape. Thus, what I refer to herein will be the diameter of the circular cross section which has equivalent area to a cross section of a wire made by my method.

The invention is particularly suited for producing wires in the diameter range of $3-6 \times 10^{-6}$ m, but will be found applicable to other diameter wires where drawing and other techniques are not effective in providing uniform diameters.

A tungsten wire produced by my process will have a particular microstructure, as indicated by the drawing. The wire 20 has a duplex microstructure, comprised of an irregular cross section core 22 having relatively large (for the scale of the wire diameter) longitudinally elongated grains 24, characteristic of a heavily drawn wire. Surrounding the core is a sheath 26 comprised of fine columnar structure portions 26, as are well known to characterize vapor deposited material. The columnar structures of portions 26 will be oriented generally radially about the wire. Typically there will be some variation in orientation caused by epitaxy off the particular grain 24 on which the columnar structure rests.

Tungsten wires made in the practice of the invention can be installed in a device for sensing angular movement, using a fluid jet, in accord with the teaching of Schuemann, U.S. Pat. No. 3,587,328 and Lopiccolo et al. U.S. Pat. No. 4,020,700, the disclosures of which are hereby incorporated by reference. Such an instrument will be expected to have improved stability and reproducibility.

Tungsten is often the preferred wire for fluidic angular rate sensors because of its strength and resistance characteristics. However, other wires may be used in such sensors. Further, the invention principles will be applicable to fine wires for other uses. For example, molybdenum can be made in uniform diameter by reacting it with an atmosphere of hydrogen enriched with $MoCl_5$, and nickel can be made in uniform diameter by reacting it with an atmosphere comprised of a carrier gas enriched with $Ni(CO)_4$.

Although this invention has been shown and described with respect to a preferred embodiment, it will be understood by those skilled in the art that various changes in form and detail thereof may be made without departing from the spirit and scope of the claimed invention.

I claim:

1. A metal wire having a diameter of less than about $6 \times 10^{-6}$ m comprised of a drawn metal core having a cross sectional area variation of more than ±3% surrounded by a layer of vapor deposited material of essentially the same composition as the core, the wire having an overall cross sectional area variation of less than ±3%, both cross sectional area variations measured over lengths of about 10 mm.

2. The wire of claim 1 characterized by a core which has been chemically etched to about $3 \times 10^{-6}$ m prior to deposition of the layer of vapor deposited material.

3. The wire of claims 1 or 2 characterized by cross sectional area variation of less than ±1%.

4. The wire of claims 1 or 2 having a composition consisting essentially of tungsten.

5. A fluidic motion sensor utilizing a fine wire sensing element, characterized by a wire of claims 1 or 2.

6. The method of making a fine metal wire of less than $6 \times 10^{-6}$ m characterized by drawing a circular cross section tungsten wire to a first diameter; electrolytically etching the wire to a second diameter smaller than the first diameter, the wire cross sectional area thereby being made non-uniform so that it varies by more than ±1% over a 10 mm length; and heating the etched wire using electric current in the presence of a heat decomposable reactant containing tungsten, to selectively deposit tungsten on the smaller cross sectional area portions of the wire, to increase the wire to a third diameter greater and more uniform in cross sectional area than characterized the wire when it was at its second diameter.

7. The method of claim 6 characterized by resistively heating the wire using a constant current through the wire.

8. The method of claim 6 characterized by heating the etched wire in an atmosphere of $WF_6$ and $H_2$, to a temperature between 250°–900° C.

9. The method of claim 6 characterized by heating the wire to 600°–700° C. in an atmosphere containing 5–15% $WF_6$, at total pressure 0.1 to 0.9 atmospheres.

* * * * *